US 6,594,148 B1

(12) United States Patent
Nguyen et al.

(10) Patent No.: US 6,594,148 B1
(45) Date of Patent: Jul. 15, 2003

(54) AIRFLOW SYSTEM

(75) Inventors: Hiep X. Nguyen, Grand Prairie, TX (US); Maurice M. Guy, Garland, TX (US); Osvaldo Garcia, Carrollton, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/052,014

(22) Filed: Jan. 16, 2002

(51) Int. Cl.[7] ................................................. H05K 7/20
(52) U.S. Cl. ....................................... 361/695; 454/184
(58) Field of Search ................. 62/259.2; 361/690–695, 361/725–727; 312/323; 454/184

(56) References Cited

U.S. PATENT DOCUMENTS

| 4,502,100 A | * | 2/1985 | Greenspan et al. | 361/695 |
| 4,644,443 A | * | 2/1987 | Swensen et al. | 361/695 |
| 5,544,012 A | * | 8/1996 | Koike | 361/695 |
| 5,949,646 A | * | 9/1999 | Lee et al. | 361/695 |
| 6,388,879 B1 | * | 5/2002 | Otaguro et al. | 361/695 |

* cited by examiner

Primary Examiner—Gregory Thompson
(74) Attorney, Agent, or Firm—Campbell Stephenson Ascolese LLP; Samuel G. Campbell, III

(57) ABSTRACT

A high efficiency multi-directional airflow system for a telecommunications equipment assembly used for housing electronic apparatuses which facilitate telecommunications functionality. The equipment assembly defines an internal cavity which can be divided into a plurality of air flow channels. Each of the plurality of air flow channels captures a sub-portion of the overall volume provided by the internal cavity. The smaller volume flow channels provide a smaller cross-sectional area through which the majority of air travels. Since the cross-sectional area is smaller, the velocity of the air through the flow channels is increased. Since the air velocity is increased, the heat transfer coefficient is also increased, thus allowing for the more efficient removal of heat from the electronic apparatuses. A set of fan trays can include a plurality of fans each directionally positioned to work in series to cause air to flow through the plurality of flow channels.

14 Claims, 7 Drawing Sheets

AIRFLOW SYSTEM

BACKGROUND

1. Field of Invention

This invention relates to telecommunications equipment systems, and specifically to an apparatus for providing air flow in a card based telecommunications equipment assembly.

2. Relevant Art

Most modern telecommunications equipment contains electronic apparatuses mounted in a chassis (also referred to as "shelf"). The chassis is generally enclosed, with a front access door, side walls, and a backplane. The chassis is enclosed to prevent stray material from entering the casing and damaging the electronic apparatus and to prevent stray emission of electromagnetic energy. Typically, the electronic apparatus housed inside the chassis includes heat generating components. Most heat generating components must not be allowed to overheat or else they may lose their effectiveness. Thus, it becomes necessary to provide for the cooling of components within the chassis.

Typically, components are cooled using air that is forced into the chassis and made to flow over the components. Conventional fan trays are typically employed to force the air through the chassis. For example, in a conventional push-pull air flow system, a fan tray is positioned at a bottom part of the chassis with an inlet opening while a second fan tray is positioned at the top part of the chassis with an exhaust opening. Unfortunately, due to the density in today's telecommunications products, the push-pull air flow system uses valuable space, which could otherwise be used for fiber routing.

SUMMARY

The present invention provides a high efficiency multi-directional airflow system for a telecommunications equipment assembly used for housing electronic apparatuses which facilitate telecommunications functionality. In accordance with the present invention, the equipment assembly defines an internal cavity which can be divided into a plurality of air flow channels. Each of the plurality of air flow channels captures a sub-portion of the overall volume provided by the internal cavity. The smaller volume flow channels provide a smaller cross-sectional area through which the majority of air travels. Since the cross-sectional area is smaller, the velocity of the air through the flow channels is increased. Since the air velocity is increased, the heat transfer coefficient is also increased, thus allowing for the more efficient removal of heat from the electronic apparatuses.

In accordance with the present invention, a set of fan trays can be used to achieve push-pull air flow through the channels. The single set of fan trays can include a plurality of fans each directionally positioned to work in series to cause air to flow through the plurality of flow channels. Advantageously, the single set of fan trays can be positioned on the same side of the equipment assembly, which allows the use of the same area for inlet and exhaust of the cooling air to increase the amount of vertical space used for routing fibers.

In one aspect of the present invention, a telecommunications equipment assembly is provided, which includes a chassis defining an internal cavity for receiving a plurality of electronic apparatus. The assembly also includes at least one divider mechanism coupled to each of the plurality of electronic apparatus, where the divider mechanisms define at least two flow channels within the internal cavity. The assembly further includes a first fan tray configured to cause air to flow through the first flow channel; and a second fan tray configured to cause the air flowing in the first channel to flow through the second flow channel. The first fan tray and the second fan tray are positioned on an area at the first end of the chassis.

In another aspect of the invention, a telecommunications equipment assembly is provided. The assembly includes a chassis defining an internal cavity for receiving a plurality of electronic apparatuses. The assembly also includes a means for defining a plurality of flow channels within the internal cavity; and a first fan placed in series with a second fan to pull air into the plurality of flow channels and to push air out from the plurality of flow channels. The first fan and the second fan are positioned on an area proximate to the same portion of the chassis.

In another aspect of the present invention a method is provided for providing air flow through a telecommunications equipment assembly. The method includes providing a chassis including an internal cavity; dividing the internal cavity into a plurality of flow channels, where the flow channels include a first end and a second end; and pulling and pushing air through the flow channels.

In yet another aspect of the present invention, a telecommunications equipment assembly is provided which includes a chassis having a first surface and which defines an internal cavity. The assembly also includes a means for dividing the internal cavity into a plurality of flow channels, and a means for pulling and pushing air through the flow channels. The means being combined on a first surface of the chassis.

The present invention provides many advantages over conventional air flow systems. For example, the use of fans in series provides a reduction in back pressure acting on each fan, which prolongs the life of each fan. The higher air velocity generated by the present invention provides for more efficient cooling due to an increase in the heat transfer coefficient. The present invention, also provides a more consistent temperature rise when used in a rack mount multi-shelve system. Because of the more efficient heat transfer capability, a higher degree of fan failure can be tolerated in the system. Since the exhaust and intake are positioned using the same area, less openings in the equipment assembly are required, thus substantially reducing the potential for unwanted EMI emission.

These and other objects, features and advantages of the present invention will be more readily apparent from the detailed description of the preferred embodiments set forth below taken in conjunction with the accompanying drawings.

DETAILED DESCRIPTION

Figure 1:
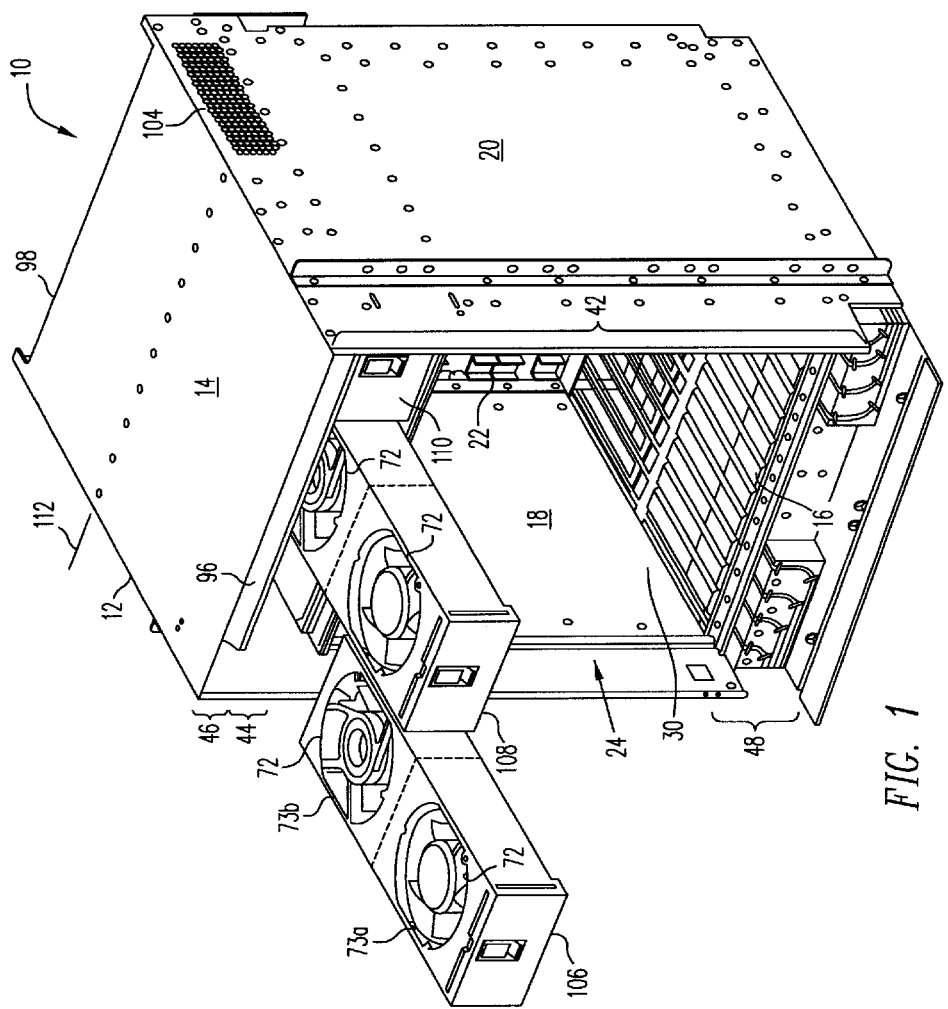
FIG. 1 is a simplified perspective view of a telecommunications equipment assembly in accordance with an embodiment of the present invention.

FIG. 1 illustrates a telecommunications equipment assembly 10 (hereinafter "shelf assembly 10" or "shelf 10") configured in accordance with an embodiment of the present invention. In this embodiment, shelf assembly 10 can include at least four sections: Cage section 42, fan tray section 44, intake/exhaust section 46 and fiber management section 48.

Cage section 42 includes a housing or chassis 12, which includes several components, such as top wall 14, a bottom wall 16, a side wall 18, a side wall 20, and a back wall 22, which collectively define an internal cavity 30. Generally, housing 12 may be made with sheet metal, injection molded plastic, or other similarly suited structural materials.

Interior cavity 30 is suitable for removably receiving one or more electronic apparatuses. In one embodiment, interior cavity 30 is large enough to be capable of removably receiving electronic apparatuses, such as optical line cards, cross-connect cards (CXC), timing and system control cards (TSC) and other types of plug-in cards (not shown), which may provide a telecommunications functionality to shelf assembly 10. An access opening 24 provides access to interior cavity 30 for replacement, removal, assembly, servicing, and/or repair of the electronic apparatuses. Optionally, top and bottom walls 14 and 16 may have slots or grooves used to support, guide, and align the plug-in cards while housed in interior cavity 30.

Back wall 22 can include a backplane, which is a printed circuit board that extends substantially the width of housing 12. The backplane includes circuitry identical to circuitry in a conventional backplane well-known in the telecommunications industry, which provides electrical characteristics, such as shielding, conductor path characteristics, including controlled impedance, current carrying capacity, paths for instrument buses, data busses, unit under test (UUT) stimulus busses, and power busses. In one embodiment, the backplane provides the electrical interface between the electronic apparatus enclosed in housing 12 and external cables. Generally, the external cables are routed through fiber management section 48.

Figure 3:
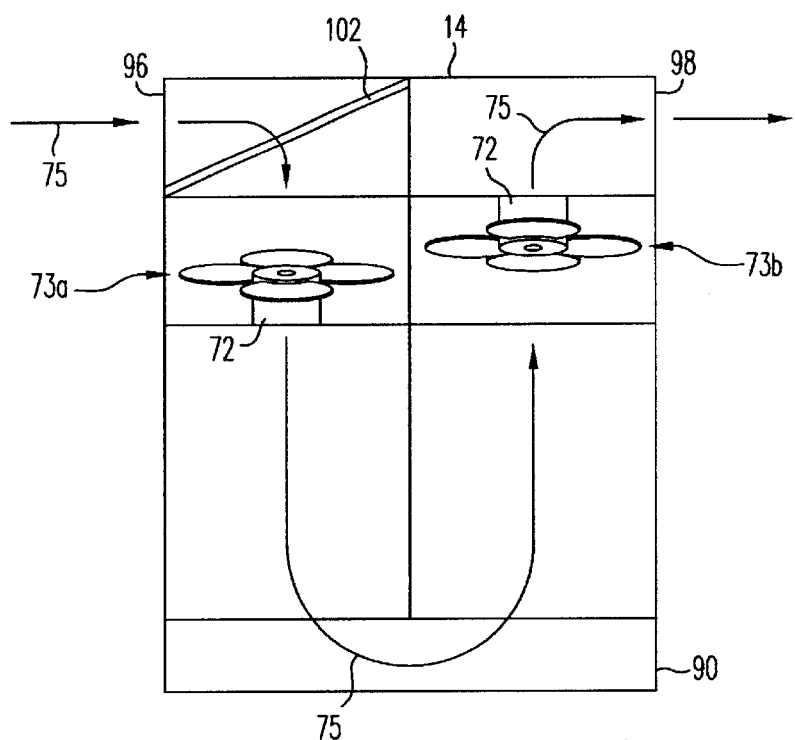
FIG. 3 is a simplified cut away side view of an embodiment of the telecommunications equipment assembly of FIG. 1.

Intake/exhaust section 46 includes an intake opening 96 and an exhaust opening 98. Intake opening 96 can include an air filter 102 (FIG. 3). Optionally, air filter 102 can be positioned at an angle relative to intake opening 96 to increase the effective size of the air filter. Each opening 96 and 98 is designed to allow air to flow out from housing 12, with a minimal amount of air pressure build-up. In one embodiment, openings 96 and 98 may extend substantially the width of housing 12 and have a height of between about 2 inches to about 3 inches. In some embodiments, due to the configuration of backplane 22, exhaust opening 98 may have to be reduced in size relative to intake opening 96 to accommodate backplane 22. To avoid unwanted pressure build-up within housing 12, a perforated exhaust section 104 (FIG. 3) can be formed on, for example, side walls 18 and 20 to allow exhaust air to escape.

Figure 2:
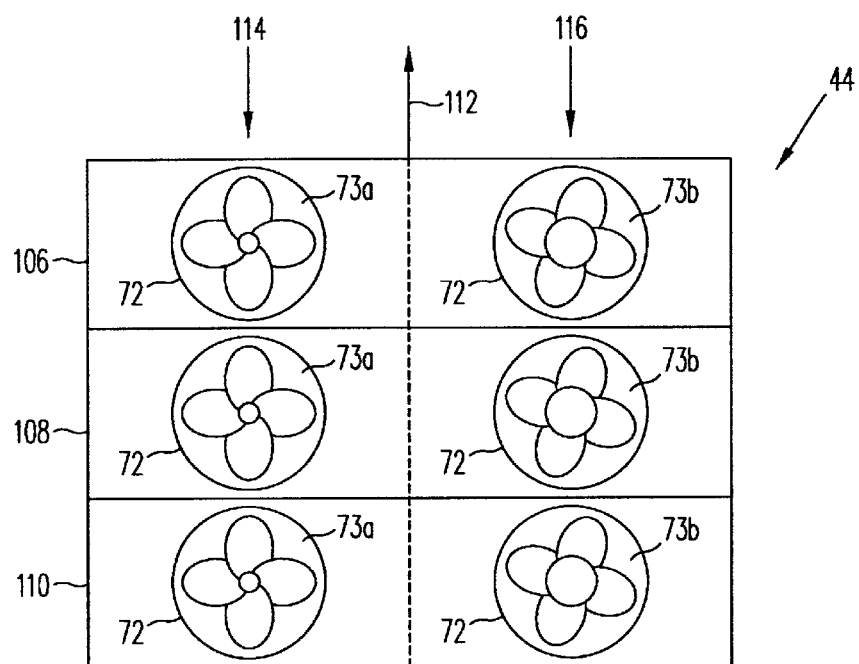
FIG. 2 is a simplified top view of a fan tray section including a row of intake fans and a row of exhaust fans in accordance with an embodiment of the present invention.

In one embodiment, fan tray section 44 can include multiple fans trays. As shown in FIGS. 1 and 2, fan tray section 44 can include three fan trays 106, 108, and 110, which can include at least six tube axial fans 72. In this embodiment, each fan tray 106, 108 and 110 can include at least two fans 72. Fans 72 are directionally positioned to force air either into or out from housing 12. For example, fan trays 106, 108, and 110 include intake fans 73a, which include propellers positioned to force air into housing 12. Similarly, fan trays 106, 108 and 110 include exhaust fans 73b, which include propellers positioned to exhaust air out from housing 12. In this embodiment, when fan trays 106, 108 and 110 are slidably mounted into fan tray section 44, the fan trays form a first row 114 of side-by-side positioned intake fans and a second row 116 of side-by-side positioned exhaust fans, one row on each side of housing centerline 112.

FIG. 3 is a simplified side view of housing 12 arranged in accordance with one embodiment of the present invention. In this embodiment, intake opening 96 is positioned proximate top wall 14 on the side of centerline 112 corresponding to intake fan row 114 (FIG. 2). Exhaust opening 98 is similarly positioned on the side of centerline 112 corresponding to exhaust fan row 116 (FIG. 2). In this configuration, air can be forced into housing 12 through opening 96 using intake fans 73a and forced out from housing 12 through exhaust opening 98 using exhaust fans 73b. This configuration allows intake fans 73a and exhaust 73b to work in series to move air through housing 12 in the direction indicted by arrows 75. Fans 72 can be any type of suitable fan, for example, a Maltese® AC or DC tube axial fan available from Comair Rotron of San Diego, Calif.

Figure 4A:
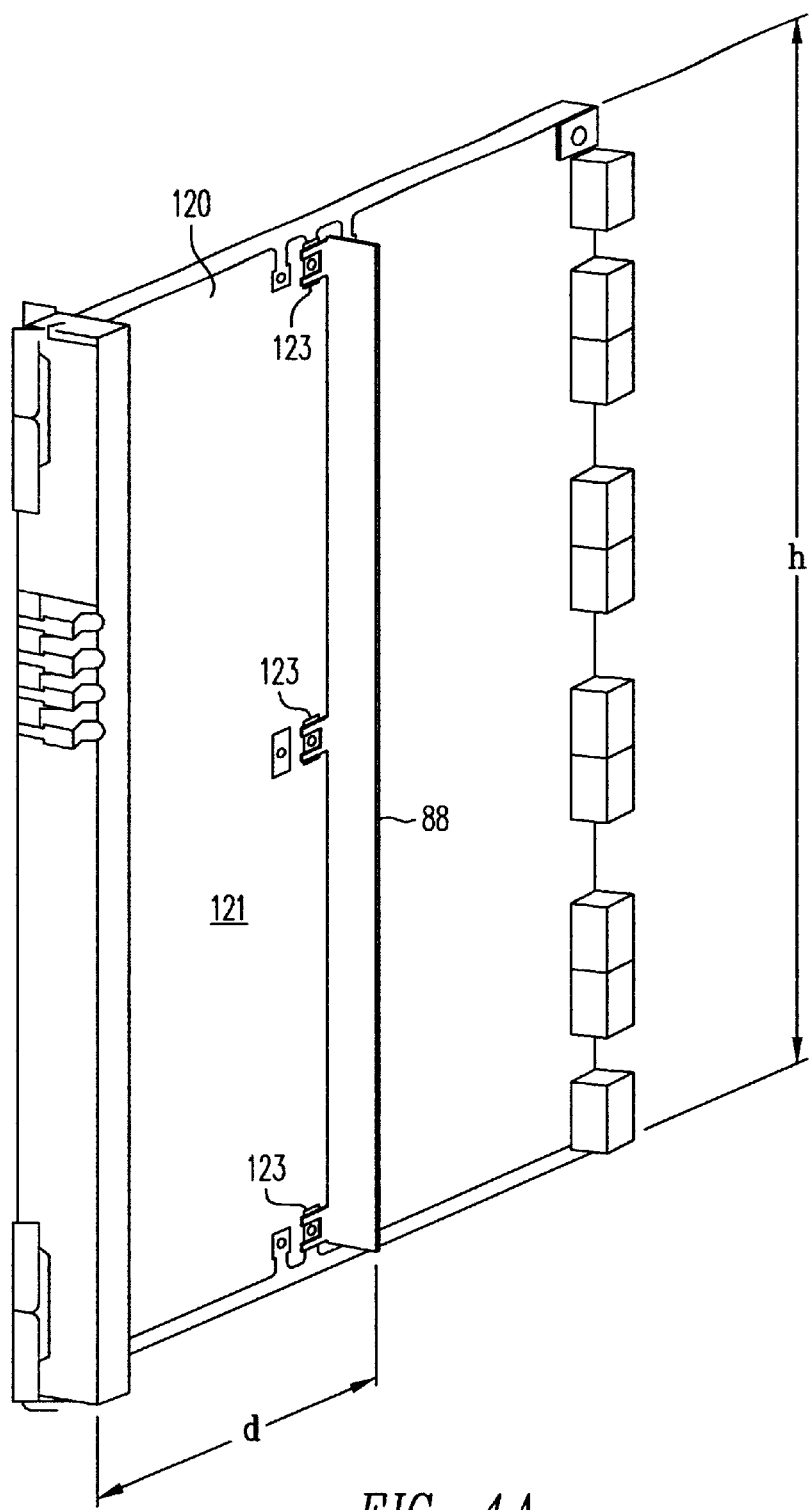
FIG. 4A is a perspective view of an electronic apparatus including a divider mechanism coupled thereto in accordance with an embodiment of the present invention.

FIG. 4A is a perspective view of an exemplary electronic apparatus 120 for use in shelf assembly 10 (FIG. 1) coupled to a divider mechanism 88 in accordance with an embodiment of the present invention. In one embodiment, divider mechanism 88 is a substantially flat rectangular member that is coupled on a first side 121 of electronic apparatus 120. Divider mechanism 88 can extend out perpendicular to first side 121. The amount that divider mechanism 88 extends can be made equal to approximately the distance w (FIG. 4B) between electronic apparatuses 120.

The height of divider mechanism 88 can be a percentage of the entire height h of the electronic apparatus 120. In this embodiment, divider mechanism 88 reaches substantially the entire height h. In other embodiments, the height of divider mechanism 88 can be between about 40% to about 100% of the height h.

Divider mechanism 88 can be positioned at any point along a depth d of apparatus 120. For example, divider mechanism 88 can be mounted at a location on electronic apparatus 120, which corresponds to a point in-between a row of intake fans 73a and exhaust fans 73b, such as along centerline 112 of equipment assembly 10 (FIG. 4B), when electronic apparatuses 120 are mounted on backplane 22.

Divider mechanism 88 can be coupled to apparatus 120 in a conventional manner, such as by bending extended portions of divider mechanism 88 to form flanges 123 and screwing, or otherwise mounting, the flanges onto apparatus 120. Divider mechanism 88 can be made of any structurally rigid material, such as plastic or sheet metal.

Figure 4B:
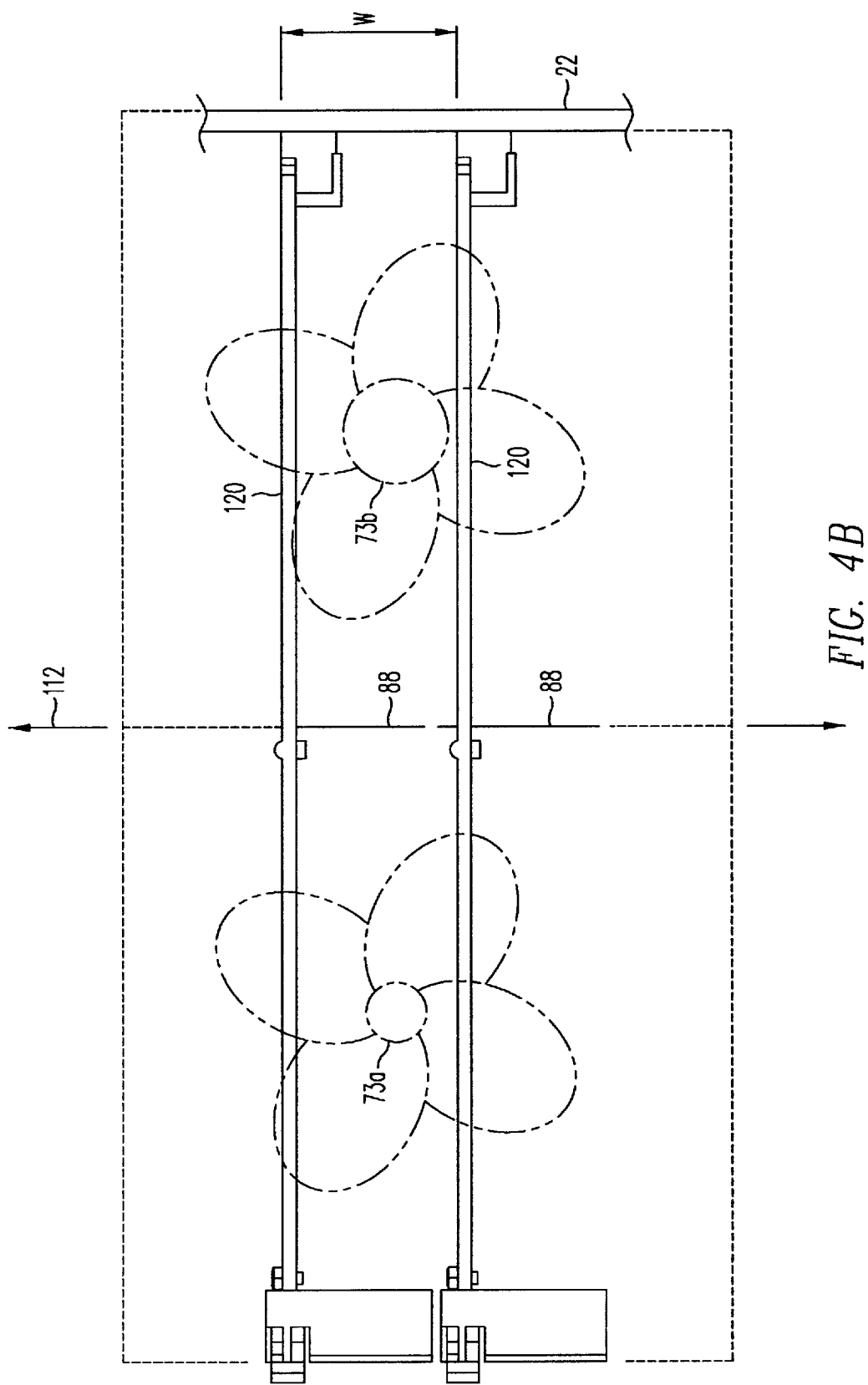
FIG. 4B is a simplified top view of a representative portion of the telecommunications assembly of FIG. 1 including side-by-side mounted electronic apparatuses of FIG. 4A in accordance with an embodiment of the present invention.

In one embodiment, at least one divider mechanism 88 is coupled to each of a plurality of electronic apparatuses 120, such as CXC, TSC and optical line cards (hereinafter "cards 120"). As shown in FIG. 4B, when cards 120 are positioned side-by-side in shelf assembly 10 and coupled to backplane 22, each divider mechanisms 88 lines up with divider mechanism on each other card 120 to form a barricade. The barricade divides internal cavity 30 (FIG. 1) into separate flow channels, for example, as illustrated in FIGS. 5A–5D. It should be noted that divider mechanisms 88 are not intended to necessarily create a barricade that creates an air tight seal between the separate flow channels, but instead are intended to direct the majority of air through the channels thus created. Because of the relative velocity of the air through the flow channels, air leakage between divider mechanisms 88 can be considered negligible.

Figure 5A:
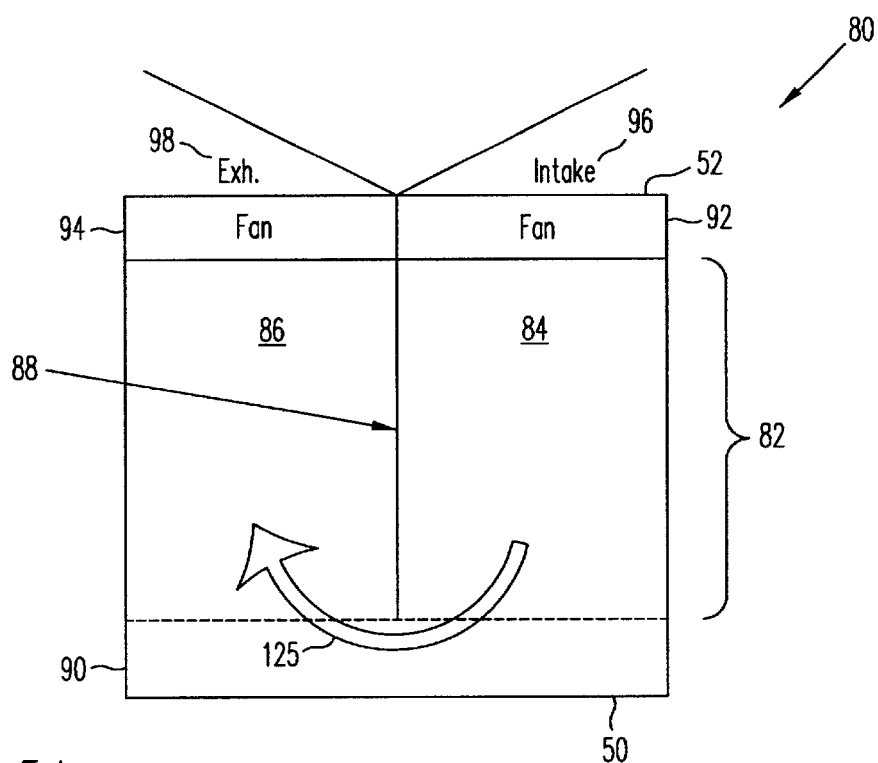
FIG. 5A is a simplified illustration of air flow in one embodiment in accordance with the present invention.

FIG. 5A is a simplified cut away side view of telecommunication equipment assembly 80 illustrating airflow direction created by divider mechanism 88 in accordance with the present invention. Telecommunications equipment assembly 80 (hereinafter "equipment assembly 80") includes a card cage section 82, which is divided into two channels 84 and 86 using the barricade created by the alignment of divider mechanisms 88 in card cage section 82. In one embodiment, intake opening 96 and exhaust opening 98 are operably positioned adjacent intake fan tray 92 and exhaust fan tray 94, respectively. In this embodiment, flow channel 84 is an intake channel coupled to intake opening 96 through intake fan tray 92. Similarly, channel 86 is an exhaust channel coupled to exhaust opening 98 through exhaust fan tray 94. Air can be forced via intake opening 96 into card cage section 82. As indicated by arrow 125 air travels through flow channel 84, around divider mechanisms 88 via plenum 90, and through flow channel 86. The air is removed from card cage section 82 via exhaust opening 98. Each fan tray 92 and 94 can include any number of fans needed to adequately provide sufficient airflow into, and out from, flow channels 84 and 86. Plenum 90 can be located on the bottom portion 50 of equipment assembly 80 to provide an open space for receiving air for distribution through card cage section 82.

Figure 5B:
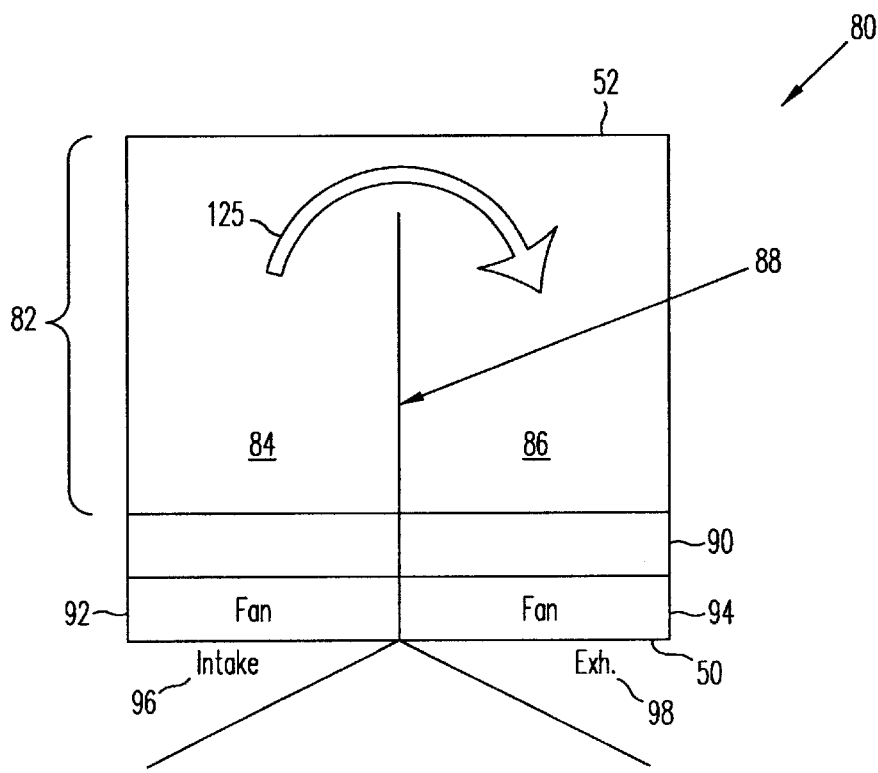
FIG. 5B is a simplified illustration of air flow in an alternative embodiment in accordance with the present invention.

FIG. 5B is a simplified illustration of an alternative embodiment of equipment, assembly 80. In this embodiment fan trays 92 and 94 are positioned on bottom portion 50 of equipment assembly 80. In a manner similar to that shown in the illustration of FIG. 5A, air travels in a path indicated by arrow 125.

Figure 5C:
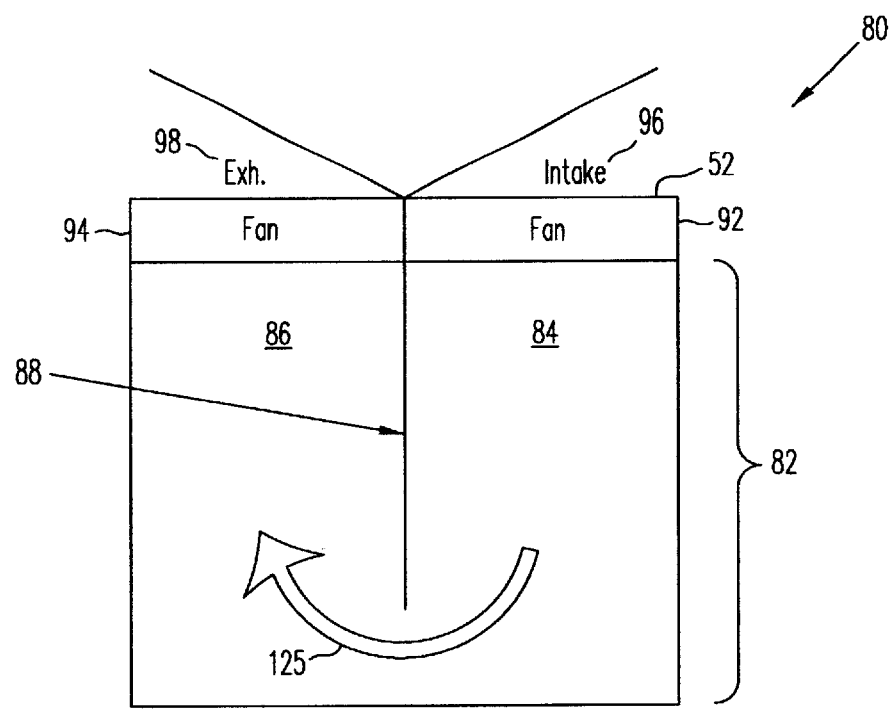
FIG. 5C is a simplified illustration of air flow in an alternative embodiment in accordance with the present invention.

FIG. 5C is a simplified illustration of an alternative embodiment of equipment assembly 80. Fan trays 92 and 94 are positioned on top portion 52 of equipment assembly 80. In this embodiment, equipment assembly 80 does not include a plenum 90 to provide an airflow path at the bottom portion 50 as in FIG. 5A. Accordingly, divider mechanism 88 can be made to extend a height which is less than the height h of electronic apparatuses 120 (FIG. 4A). The shorter divider mechanism 88 allows air to travel from flow channel 84 to flow channel 86 around divider mechanism 88 in a path indicated by arrow 125.

Figure 5D:
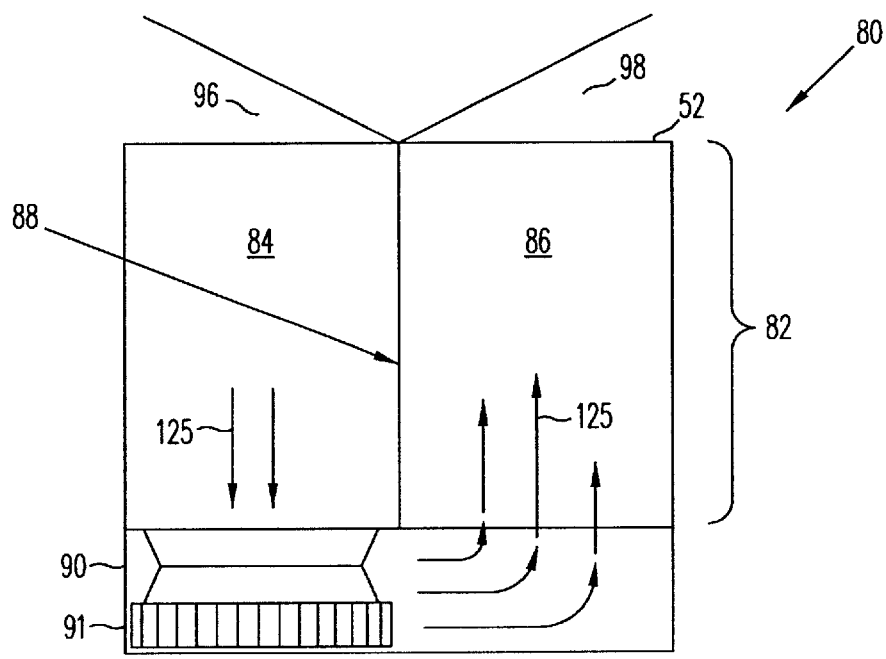
FIG. 5D is a simplified illustration of air flow in an alternative embodiment in accordance with the present invention.

FIG. 5D is a simplified illustration of an alternative embodiment of equipment assembly 80. In this embodiment, fan trays 92 and 94 are replaced by an impeller fan 91 positioned on bottom portion 50 of equipment assembly 80 between flow channels 84 and 86. Alternatively, impeller fan 91 can be positioned on top portion 52 at the end of flow channel 86. Impeller 91 can receive air parallel to the rotational axis of impeller fan 91 and dispatch air perpendicular to the rotational axis of impeller 91. Accordingly, air travels in a path indicated by arrows 125.

In electronic equipment assemblies, the continuous flow of cooling air helps to contain and eventually extinguish fires, since the air can keep the components in the assembly from reaching the flash temperature. Advantageously, positioning fan trays 92 and 94 on top portion 52 can help to increase fan survivability. In this embodiment, intake fan tray 92 positioned on top portion 52 pushes cool air down into card cage section 82 and therefore is not affected by a fire burning within card cage section 82. Since exhaust fan tray 94 is also positioned on top portion 52, any fire debris that may be blown down by the fans of intake fan tray 92 falls safely into plenum 90 or onto the bottom of card cage section 82. Since the survivability of each fan is increased in this configuration, any fire in card cage section 82 is more likely to be extinguished before any significant damage is realized.

In this operational embodiment, air flow area is reduced into smaller cross sectional areas. Accordingly, for the same flow rate, the air flow velocity is multiplied, thus increasing the heat transfer coefficient. For example, in a typical equipment assembly with a total fan output of 600 cfm, the air speed may be expected to be about 300 lfm, due in part to high back pressure. In the present invention, when the same equipment system is divided into two flow channels using divider mechanisms 88 and intake and exhaust fans 73a and 73b (FIG. 2) at each end of the flow, respectively, the velocity can be expected to be increased to about 600 lfm. In this embodiment, any high pressure that may otherwise occur is compensated for by the series arrangement of the intake and exhaust fans 73a and 73b. Since intake and exhaust openings 96 and 98, respectively, are positioned on the same side of shelf assembly 10, much desired vertical space for routing fibers is provided.

Figure 6:
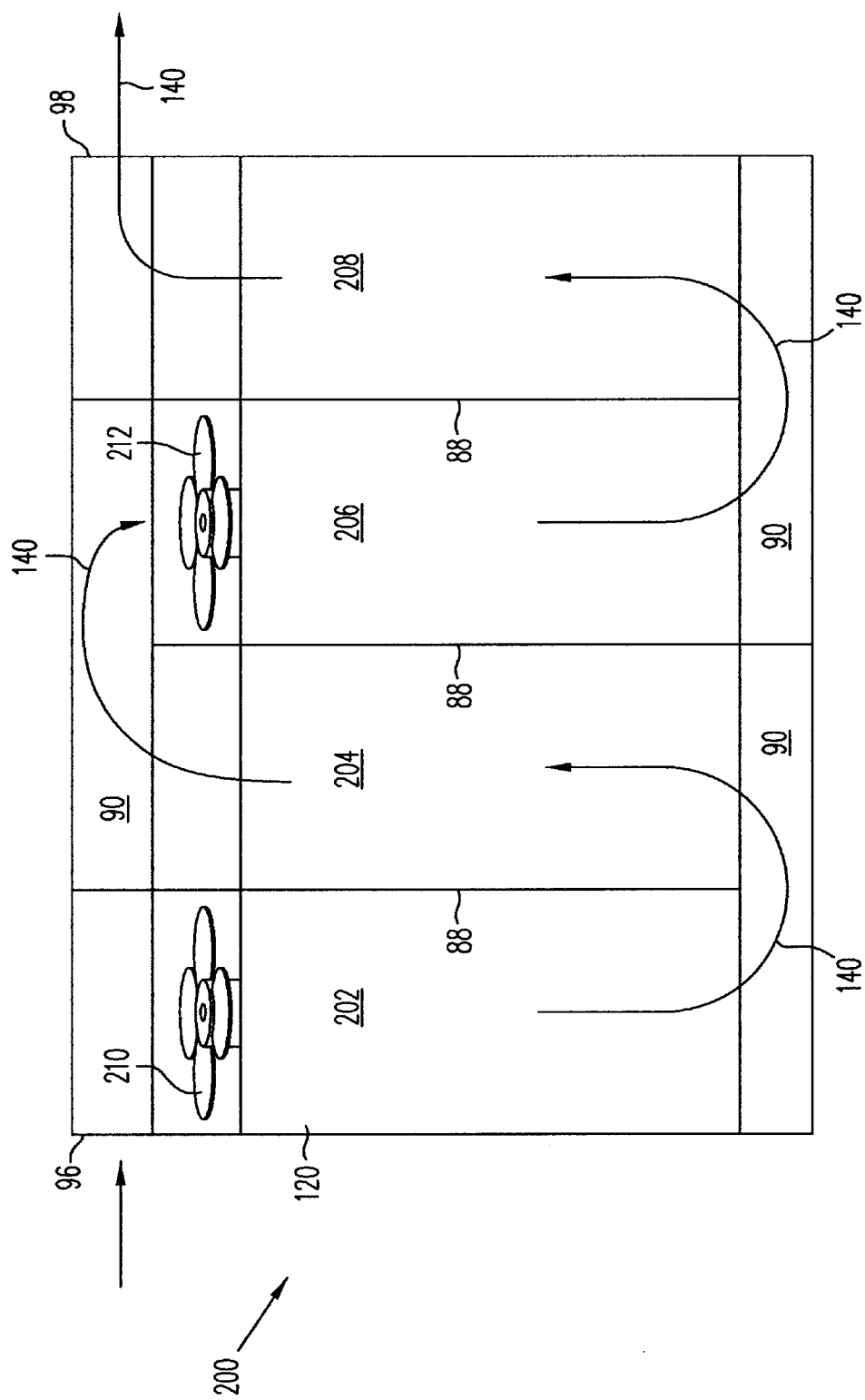
FIG. 6 is a simplified side view of the telecommunications assembly including electronic apparatuses having multiple divider mechanisms and multiple flow channels in accordance with an embodiment of the present invention.

FIG. 6 is a simplified cut away side view of shelf assembly 200 in accordance with an alternative embodiment of the present invention. Equipment assembly 200 includes electronic apparatuses 120 each including a plurality of divider mechanisms 88 to create a plurality of flow channels within shelf assembly 200. In this exemplary embodiment, four flow channels 202, 204, 206 and 208 are created with fans 210 and 212, representative of a row of fans, for providing the push-pull effect. In this embodiment, air flows into intake opening 96 and through each flow channel 202, 204, 206, and 208 in the direction of arrows 140 until exhausted through exhaust opening 98.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A telecommunications equipment assembly comprising:
   a chassis defining an internal cavity for receiving a plurality of electronic apparati, said chassis including a first end and a second end;
   at least one divider mechanism coupled to each of said plurality of electronic apparati, said at least one divider mechanisms defining at least two flow channels within said internal cavity; and
   a first fan tray configured to cause air to flow through said first flow channel; and
   a second fan tray configured to cause said air flowing in said first channel to flow through said second flow channel,
   said first fan tray and said second fan tray positioned on an area at said first end of said chassis.

2. The assembly of claim 1, further comprising an intake opening and an exhaust opening, wherein each of said openings is defined on an area at said first end of said chassis.

3. The assembly of claim 2, wherein said intake opening is operably coupled to said first fan tray for directing air into said first fan tray and said exhaust opening is operably coupled to said second fan tray for directing air out from said second fan tray.

4. The assembly of claim 1, wherein said at least one divider mechanism extends perpendicularly outward from a surface of said each of said plurality of electronic apparati.

5. The assembly of claim 1, wherein said first end comprises a top portion of said chassis.

6. The assembly of claim 1, further comprising:
   at least two divider mechanisms coupled to each of said plurality of electronic apparati, wherein said at least two divider mechanisms define at least three flow channels within said internal cavity and said at least one divider mechanism is a one of said two divider mechanisms; and
   a third fan tray configured to cause air to flow through a third flow channel, wherein
      said third fan tray is positioned on an area at said first end of said chassis.

7. A telecommunications equipment assembly comprising:
   a chassis defining an internal cavity for receiving a plurality of electronic apparati;
   at least one means for defining a plurality of flow channels within said internal cavity coupled to each of said plurality of electronic apparati; and
   a first fan placed in series with a second fan to pull air into said plurality of flow channels and to push air out from said plurality of flow channels,
   said first fan and said second fan positioned on an area proximate to a portion of said chassis.

8. The assembly of claim 7, further comprising an intake opening and an exhaust opening, wherein each of said openings is defined on an area proximate to said first fan and said second fan.

9. The assembly of claim 8, wherein said intake opening is operably coupled to said first fan for directing air into said first fan and said exhaust opening is operably coupled to said second fan for directing air out from said second fan.

10. The assembly of claim 7, wherein said means comprises at least one divider mechanism mounted to and extending perpendicularly outward from a surface of said each one of said electronic apparati.

11. The assembly of claim 7, wherein said portion of said chassis comprises a top portion of said chassis.

12. The assembly of claim 7, wherein said means comprises at least two divider mechanisms coupled to each of said plurality of electronic apparati, said at least two divider mechanisms defining at least three flow channels within said internal cavity;
   a third fan configured to cause air to flow through said flow channels; and
   said third fan positioned on an area proximate to said portion of said chassis.

13. A method for providing air flow through a telecommunications equipment assembly comprising:
   providing a chassis including an internal cavity;
   dividing said internal cavity into a plurality of flow channels, wherein
      said flow channels includes a first end and a second end,
      said dividing comprises inserting a plurality of electronic apparati into said internal cavity,
      each of said electronic apparati is coupled to a divider mechanism, and
      said divider mechanism forms at least one barricade within said internal cavity to form said flow channels; and
   pulling and pushing air through said flow channels.

14. A telecommunications equipment assembly comprising:
   a chassis having a first surface and defining an internal cavity;
   means for dividing said internal cavity into a plurality of flow channels, wherein
      said flow channels including a first end and a second end,
      said means for dividing comprises a plurality of divider mechanisms each mounted to an electronic apparatus, and
      said divider mechanism form at least one barricade within said internal cavity to form said flow channels when said electronic apparatus are inserted into said internal cavity; and
   means for pulling and pushing air through said flow channels combined at said first surface.

* * * * *